United States Patent [19]

Brown et al.

[11] Patent Number: 4,577,294

[45] Date of Patent: Mar. 18, 1986

[54] REDUNDANT MEMORY CIRCUIT AND METHOD OF PROGRAMMING AND VERIFYING THE CIRCUIT

[75] Inventors: George W. Brown; Phi Thai, both of San Jose, Calif.

[73] Assignee: Advanced Micro Devices, Inc., Sunnyvale, Calif.

[21] Appl. No.: 485,695

[22] Filed: Apr. 18, 1983

[51] Int. Cl.[4] .................... G11C 11/40; G11C 7/00
[52] U.S. Cl. ..................... 365/200; 365/96; 371/10
[58] Field of Search .............. 365/200, 96, 201, 230; 371/10, 8

[56] References Cited

U.S. PATENT DOCUMENTS

| | | | |
|---|---|---|---|
| 4,250,570 | 2/1981 | Tsang et al. | 365/200 |
| 4,358,833 | 11/1982 | Folmsbee et al. | 365/200 |
| 4,365,319 | 12/1982 | Takemae | 365/200 |
| 4,389,715 | 6/1983 | Eaton, Jr. et al. | 365/200 |
| 4,428,068 | 1/1984 | Baba | 365/200 |
| 4,485,459 | 11/1984 | Ven Kateswaran | 365/200 |

OTHER PUBLICATIONS

Huber, "The 64K RAM: A Fault Tolerant Semiconductor Memory Design", Bell Laboratories Record, Jul./Aug. 1979, pp. 199–204.

Posa, "What to Do When the Bits Go Out," Electronics, Jul. 28, 1981, pp. 117–134.

J. Cocke, "Read and Test to Reduce Redundancy Requirements in Memories", IBM Tech. Disclosure Bulletin, vol. 15, No. 3, Aug. 1972, pp. 885–886.

Primary Examiner—Stuart N. Hecker
Assistant Examiner—Glenn A. Gossage
Attorney, Agent, or Firm—Patrick T. King; J. Vincent Tortolano; Gerald B. Rosenberg

[57] ABSTRACT

A redundant memory circuit having a memory for storing information in a matrix of interconnected rows and columns, and a row and a column address decoder to access the rows and columns. The memory has a redundant row or rows to replace a defective row or rows in the matrix and a programmable decoder which is programmed with the row address of the defective row to access the redundant row. The row and column address decoders are used to access the defective row and to sequentially access the columns so as to entirely disconnect the defective row from the columns. The programmable decoder is then programmed with the defective row address, bit by bit, in response to the column addresses, to access the redundant row. After this procedure, a verification circuit can be used to verify that the redundant row can be accessed and that the programmable decoder is properly programmed to decode only one address to one row.

37 Claims, 5 Drawing Figures

REDUNDANT MEMORY CIRCUIT AND METHOD OF PROGRAMMING AND VERIFYING THE CIRCUIT

BACKGROUND OF THE INVENTION

1. Field of the Invention

The present invention relates generally to apparatus for accessing stored information and, more specifically, to a redundant memory circuit and a method of programming the circuit.

2. Discussion of Background and Prior Art

A wide variety of apparatus exists for accessing stored information. One type of apparatus is known as a redundant memory circuit, which has a memory for storing the information and circuitry for accessing the stored information. The memory, such as a programmable read-only memory (PROM) or a random access memory (RAM), generally has an array of programmable data bit storage elements arranged in a matrix of interconnected rows and columns. The circuitry used to access the information stored on the memory includes row and column address decoders which receive and decode row and column addresses and, thereby, activate the corresponding rows and columns. In, for example, a PROM, each programmable data bit storage element is a fuse which is programmed or "blown," i.e., opened, to store a data bit of one logic level, e.g., logic 1, or left closed to store a data bit of the other logic level, e.g. logic 0. The redundant memory circuit can be manufactured, for example, as an integrated circuit (IC) on a semiconductor chip and housed in an IC package.

In the manufacture of the memory, any one or more well-known defects can occur which cause a given bit or bits in a given row to be unusable for storing the information. Consequently, the redundant memory circuit typically is manufactured with the memory having a redundant row to replace the defective row and a programmable row address decoder which is used to access the redundant row in response to the address to the defective row. A general algorithm for making use of the redundant memory circuit involves two basic operations, which are first to deselect the defective row and then secondly to select the redundant row.

U.S. Pat. No. 4,250,570 to Tsang et al., issued Feb. 10, 1981, discloses such a redundant memory circuit. Two embodiments are described for deselecting a defective row. One of the two embodiments permanently physically deselects the defective row from its associated row address decoder, while the other embodiment electronically deselects the defective row from its row address decoder whenever the defective row is addressed. Tsang et al. also disclose an embodiment for selecting the redundant row.

In the one embodiment of the patent for physically deselecting a defective row, additional circuitry is provided between each row address decoder and the corresponding row of the memory. This additional circuitry includes a programmable fuse and other components, external of the memory, for coupling the output of the particular row address decoder to the corresponding row. After a defective row in the memory is identified, the corresponding row address decoder is enabled to pass programming current through the fuse and the other components, thereby opening the fuse and physically disconnecting the defective row from its row address decoder.

A problem with the one embodiment for physically deselecting the defective row is the fact that the additional circuitry is required between each row address decoder and the associated row in the memory, which has disadvantages such as the need for increased space on the IC chip to support this circuitry and higher manufacturing costs. Also, in the course of programming the memory to store the data bits, a good or non-defective row can be undesirably deselected. This can occur as a result of the programming current that is developed in the good row to store the bits causing current to flow through and open the external programmable fuse and, thereby, physically disconnect the good row from the corresponding row address decoder. Furthermore, while the defective row is physically disconnected from the corresponding row address decoder, internally of the memory the entire defective row, particularly the unprogrammed or closed data bit storage elements, is not disconnected from all the columns of the memory matrix. This means that the defective row will have parasitic capacitance that is coupled to the columns. Therefore, upon reading a good row, the parasitic capacitance tied to the columns that are also interconnected with the defective row still must be discharged, thereby disadvantageously reducing the speed of the memory access.

In the other embodiment of Tsang et al. for electronically deselecting a defective row, a redundant row address decoder, in particular a NAND gate, responds to the address to the defective row by outputting a signal to access the associated redundant row. In addition, this output signal is coupled through an inverter to disable all the other row address decoders associated with their corresponding rows, one of which is the row address decoder that also receives the address to the defective row. Thus, all the rows including the defective row, but not the redundant row, are electronically deselected when the address to the defective row is received by the redundant row address decoder. One disadvantage with this embodiment is that a delay is introduced in accessing the data stored in the redundant row, thereby reducing memory access speed. This is because a significant amount of time is needed to fully and reliably disable the other row address decoders before access should be made to the redundant row. Furthermore, as with the one embodiment mentioned above, the entire defective row is not disconnected internally from the columns, thereby resulting in the same disadvantage of reduced memory access speed upon reading a good row.

In the embodiment of Tsang et al. for selecting the redundant row, the redundant row address decoder is programmed to decode or respond to the address of the defective row to access the redundant row. An address buffer and associated decoder fuses of the decoder are associated with each bit of the defective row address. Essentially, the programming of the redundant row address decoder occurs bit-by-bit, in which all the address buffers except the address buffer corresponding to the bit currently being programmed are held at a high voltage level. Programming current is then passed through or sunk by the one address buffer to program one of the associated decoder fuse. The remaining decoder fuses associated with the remaining address buffers are programmed in the same manner with all the address buffers except one being held at the high voltage level at any one time during the programming.

A disadvantage with the prior programming of the redundant row address decoder is that at any given time all but one of the address buffers must be at a high voltage level. This presents a significant multiplexing problem in that a multiplexer must simultaneously switch very high input voltages to all of the address buffers but the one, and this is difficult to accomplish. This multiplexing of the high input voltages also complicates the method of programming the redundant row address decoder.

Furthermore, the programming current for the decoder fuses of the redundant row address decoder is not supplied in a controlled manner. That is, the programming current develops or increases through each decoder fuse until the fuse opens slightly. This has the disadvantage that the fuse may not open sufficiently from a programming point of view so as to provide a wide gap which reliably represents the bit of the row address. Still furthermore, the redundant row address decoder of the patent uses multiple emitter transistors (METs) whose output is coupled to the redundant row, which METs inherently have a low base to emitter voltage breakdown. Consequently, during the programming phase of the redundant row address decoder, the redundant row can be undesirably subjected to the programming voltages through this emitter-base voltage breakdown phenomenon, the consequence of which is that the programming voltage must be set at a lower limit than is optimum.

Another overall disadvantage of prior redundant memory circuits is that programming pads on the IC chip through which the programming currents are supplied, in addition to the other typical bonding pads, such as those through which the row and column addresses are supplied, are required in order to deselect a defective row and select the redundant row, thereby undesirably increasing the number of components needed for the circuit. Also, the programming of the prior redundant memory circuits typically occurs at a point in the manufacturing process known as the "wafer sort". When performed at this stage, the programming current must pass through long needle-like probes which have an undesirable resistive and inductive effect that limits the programming voltage and induces inductive voltage overshoots and ringing when a decoder fuse opens, thus potentially stressing the chip.

SUMMARY OF THE INVENTION

It is an object of the present invention to provide a novel apparatus for accessing stored information.

It is another object of the present invention to provide a redundant memory circuit having a minimum number of components.

It is still another object of the present invention to prevent the deselection of an otherwise good row of a memory.

Yet another object of present invention is to provide fast access to a memory having a defective row, i.e., no loss of access time when accessing a redundant row.

Another object of the present invention is to reliably and conveniently program the redundant memory circuit to deselect a defective row and select a redundant row.

Still another object of the present invention is to be able to easily program the redundant row address decoder of the redundant memory circuit to decode the address of a defective row of a memory.

Another object of the present invention is to be able to provide relatively high programming voltages and currents for programming the redundant memory circuit.

Additional objects, advantages and novel features of the invention will be set forth in part in the description which follows, and in part will become apparent to those skilled in the art upon examination of the following or may be learned by practice of the invention. The objects and advantages of the invention may be realized and obtained by means of instrumentalities and combinations particularly pointed out in the appended claims.

STATEMENT OF THE INVENTION

To achieve the foregoing and other objects in accordance with the purpose of the present invention, as embodied and broadly described herein, the apparatus of this invention can comprise a memory having a matrix of a plurality of rows and columns and a redundant row, row address decoder means and column address decoder means for receiving and decoding, respectively, row and column addresses to access the plurality of rows and columns and to deselect a defective row of the plurality of rows, programmable decoder means, coupled to the redundant row, for receiving and decoding any one of the row addresses to select the redundant row and means, coupled to the column address decoder means, for programming the programmable decoder means to decode the row address of the defective row.

Preferably, the entire defective row is disconnected from the plurality of columns. It is also preferred that the programmable decoder means has a plurality of decoder columns having programmable decoder elements which are sequentially accessed to sequentially provide programming current for the decoder elements. Preferably, also, the apparatus includes means for verifying the selection of a redundant row and the proper programming of the programmable decoder means.

In a further aspect of the present invention, in accordance with its objects and purposes, a method is provided of substituting or replacing, in a memory having a matrix of a plurality of rows and a plurality of columns and a redundant row, a defective row of the plurality of rows with the redundant row, the memory being accessible in response to row addresses and column addresses, comprising the steps of disconnecting entirely the defective row from the plurality of columns in response to a row address to the defective row and the column addresses, and programming a programmable decoder means with the defective row address to access the redundant row in response to the defective row address and the column addresses.

STATEMENT OF DERIVED BENEFITS AND ADVANTAGES

With the present invention, the row address and column address decoder means that are used to access the memory are also used to deselect an entire defective row from the plurality of columns, thereby not requiring additional components for the deselection algorithm and entirely disconnecting the defective row from the columns so as not to reduce the speed for access to a good row. The present invention also prevents deselecting a good row since it does not require any comparable fuse external to the memory, as in prior redundant memory circuits, and can select a redundant row by programming a redundant row address decoder with high programming voltages because this programming can occur via the usual IC package pins and at the "package level", rather than at "wafer sort". Furthermore, such programming can occur without the multiplexing problem of the prior redundant memory circuits, which results from using the column addresses for this function in the present invention. Also, the deselection and selection programming, because it can occur after the redundant memory circuit is housed in the IC package, has the advantage of enabling a user or manufacturer to perform the programming. Still furthermore, the deselection of a defective row and proper selection of the redundant row can be verified by the manufacturer or the user of the package and without requiring any additional IC package pins.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE INVENTION

Reference will now be made in detail to the present preferred embodiment of the invention, an example of which is illustrated in the accompanying drawings.

Figure 1:
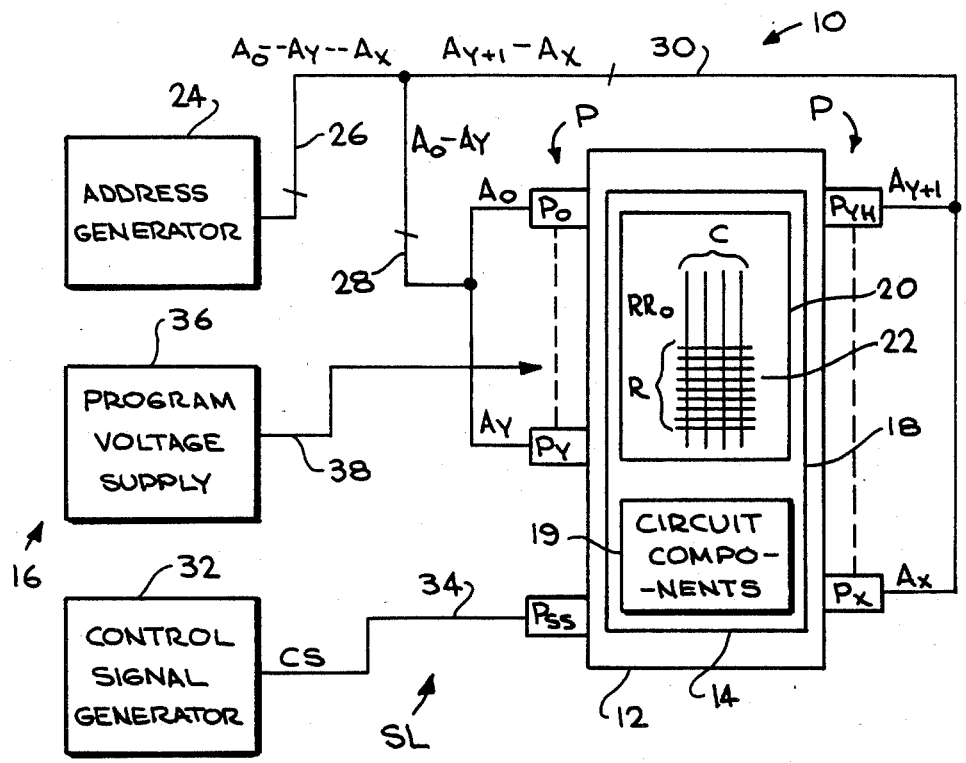
FIG. 1 is a block diagram of an overall system having the present invention.
Figure 5:
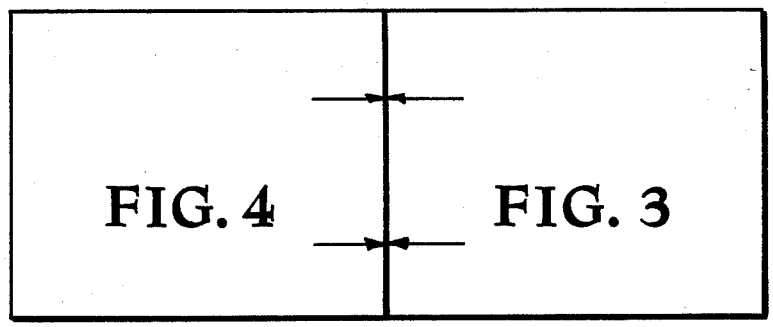
FIG. 5 shows the relationship of FIG. 3 to FIG. 4.

FIG. 1 illustrates a system 10 having an integrated circuit (IC) package 12 which houses programmable apparatus 14 for accessing stored information. The package 12 includes a plurality of pins P for receiving various signals over signal lines shown generally at SL and circuitry shown generally at 16 for producing the various signals on SL. The package 12 and, in particular, the apparatus 14, is programmed in response to the signals on SL and after such programming becomes a separate useful product independent of the circuitry 16.

Specifically, the apparatus 14 is a redundant memory circuit 18 which, among other circuit components 19 to be described, includes a memory 20 for storing information in a matrix 22 of a plurality of rows R and a plurality of columns C interconnected with the rows R. As one example, matrix 22 also has at least one redundant row $RR_0$ which can be selected in accordance with the present invention to replace a defective row in the plurality of rows R. The memory 20 can be, for example, a programmable read-only memory (PROM) or a random access memory (RAM) or other type of programmable memory. And, while the redundant memory circuit 18 is indicated as being implemented as an integrated circuit (IC), it will become appreciated that the redundant memory circuit 18 can constitute other types of circuit implementation.

The circuitry 16 includes an address generator 24 for generating addresses $A_o \ldots A_y \ldots A_x \ldots$ over address lines 26 of SL. In particular, address generator 24 generates Y-bit column addresses $A_0$-$A_Y$ that are coupled from lines 26 and over lines 28 to pins $P_0$-$P_Y$ and (X-Y)-bit row addresses $A_{Y+1}$-$A_X$ that are coupled from lines 26 and over lines 30 to pins $P_{Y+1}$-$P_X$. Bits $A_0$-$A_Y$ of column addresses $A_0$-$A_Y$, which are received at pins $P_0$-$P_Y$, respectively, identify the plurality of columns C, respectively, with bit $A_Y$ also being a control bit that is used for example, if memory 20 has more than one redundant row $RR_0$, as will be further described. Bits $A_{Y+1}$-$A_X$ of row addresses $A_{Y+1}$-$A_X$ are coupled over lines 30 to pins $P_{Y+1}$-$P_X$, respectively, and identify the plurality of rows R, respectively. Thus, for example, if matrix 22 has 32 columns C, then generator 24 produces 5-bit column addresses $A_0$-$A_4$ with $A_4$ also used for control purposes, and if matrix 22 has 128 rows R, then generator 24 produces 7-bit row addresses $A_5$-$A_{11}$.

A signal generator 32 produces a control signal on a line 34 of SL. For example, a chip select (CS) signal is produced by signal generator 32 on line 34 and is received by a pin $P_{CS}$ of package 12. A programming voltage supply 36 supplies a programming voltage over a line 38 that is coupled to, for example, pin $P_3$ (not specifically shown) of package 12. Pin $P_3$, therefore, is used for purposes of receiving bit $A_3$ of the column addresses $A_0$-$A_4$ and for receiving the programming voltage. As will be further described, CS controls the gating of programming current produced in response to the programming voltage on line 38 to program the redundant memory circuit 18.

Figure 2:
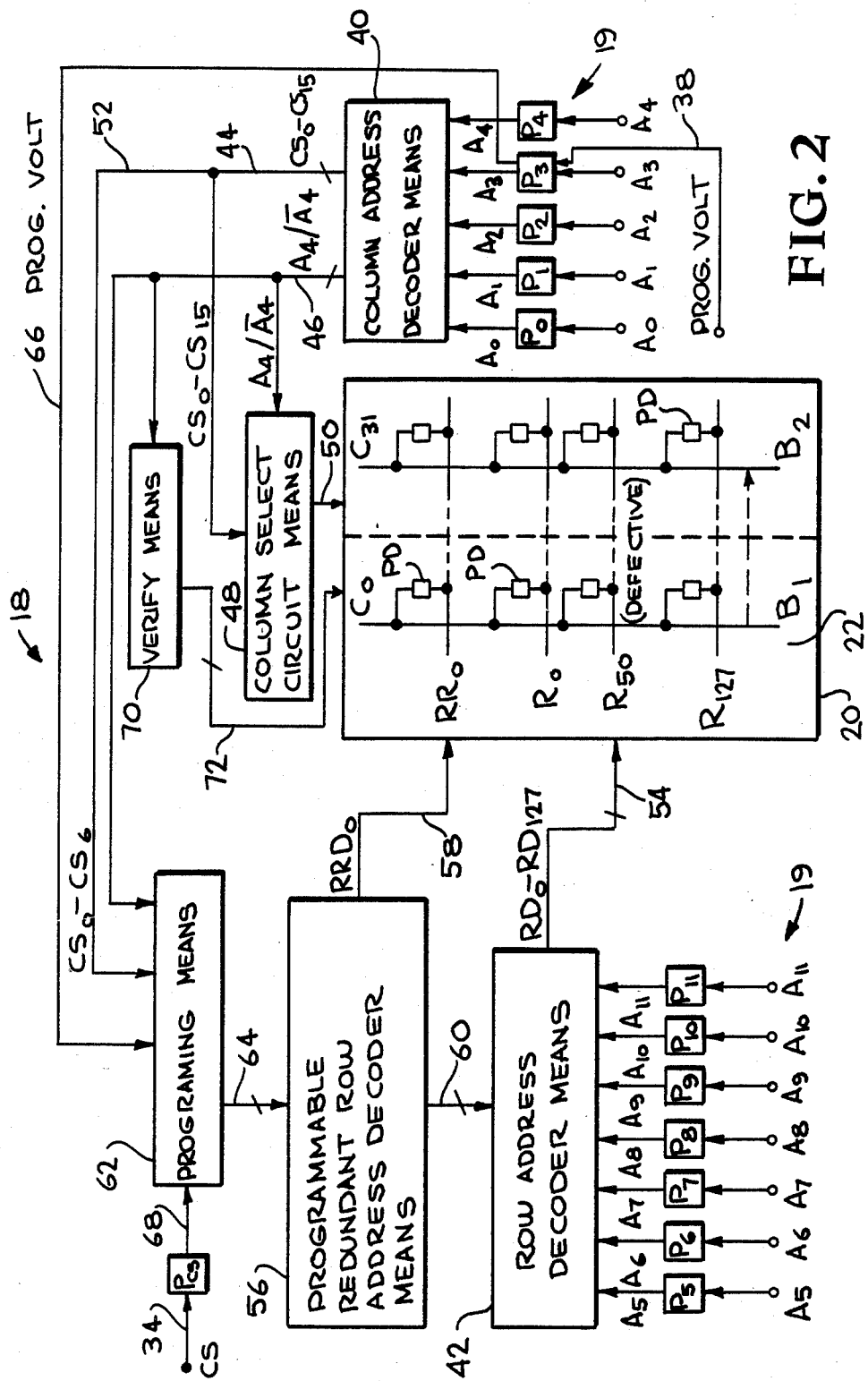
FIG. 2 is a block diagram of the apparatus of the present invention.

FIG. 2 shows in more detail the redundant memory circuit 18, including the memory 20 and matrix 22 for storing information. In the present example, the matrix 22 of memory 20 has 32 columns $C_0$-$C_{31}$ and 128 rows $R_0$-$R_{127}$ which are interconnected by programmable devices PD that constitute data bit storage elements. The matrix 22 also includes at least one redundant row $RR_0$ extending across the plurality of columns $C_0$-$C_{31}$ and having the programmable devices PD to store data that otherwise would be stored at a defective row $R_0$-$R_{127}$. As also indicated, the memory 20 can be divided into, for example, 2 banks $B_1$ and $B_2$. Columns $C_0$-$C_{15}$ can extend along bank $B_1$ and columns $C_{16}$-$C_{31}$ can extend along bank $B_2$. Bit $A_4$, as will further be described, can be used to activate columns $C_0$-$C_{15}$ of bank $B_1$, while bit $\overline{A_4}$ can be used to activate columns $C_{16}$-$C_{31}$ of bank $B_2$.

As will be further described, for any number of well-known reasons, the matrix 22 may have one or more defects which make a given row $R_0$-$R_{127}$ unusable for storing one or more data bits via programmable devices PD. For example, a given defect may prevent row $R_{50}$ from being used for the storage of the information. Consequently, in accordance with the present invention, the defective row $R_{50}$ will be deselected and the redundant row $RR_0$ will be selected to replace the defective row $R_{50}$. In particular, the entire row $R_{50}$ will be disconnected from the plurality of columns $C_0$-$C_{31}$ by the programming of the programmable devices PD. The manner of first detecting if a row $R_0$-$R_{127}$ is defective is well-known and can occur during a procedure known as "array blank checking."

The redundant memory circuit 18 also has column address decoder means 40 for receiving and decoding bits $A_0$-$A_3$ of the column addresses $A_0$-$A_4$ via pins $P_0$-$P_3$ and for receiving and decoding $A_4$ via pin $P_4$. The redundant memory circuit 18 also includes row address decoder means 42 for receiving and decoding the row addresses $A_5$-$A_{11}$ via pins $P_5$-$P_{11}$. In response to $A_0$-$A_3$ of the column addresses $A_0$-$A_4$, decoder means 40 outputs on lines 44 a plurality of column select signals $CS_0$–$CS_{15}$ and, in response to $A_4$, decoder means 40 outputs $A_4$ and $\overline{A}_4$ on lines 46.

A column select circuit (CSC) means 48 selects or activates the plurality of columns $C_0$–$C_{31}$ over lines 50 in response to $CS_0$–$CS_{15}$ on lines 44, respectively, and in response to $A_4$ and $\overline{A}_4$ on lines 46. Branch lines 52 from lines 44 carry $CS_0$–$CS_6$ for purposes to be more fully described below.

Row address decoder means 42 responds to the row addresses $A_5$–$A_{11}$ by outputting on lines 54 row driver (RD) signals $RD_0$–$RD_{127}$, respectively, to access or drive on the rows $R_0$–$R_{127}$. Thus, for example, an entire row R of matrix 22 can be accessed by holding the row address $A_5$–$A_{11}$ to that row at decoder means 42 while incrementing or sequencing the column addresses $A_0$–$A_4$ to sequentially generate $CS_0$–$CS_{15}$ and, thereby, sequentially select all the columns $C_0$–$C_{31}$ coupled across the one row R. This row and column addressing algorithm, as will be further described, is used to deselect any defective row R, such as the defective row $R_{50}$.

Redundant memory circuit 18 also includes programmable redundant row address decoder means 56 for accessing redundant row $RR_0$ via a line 58 carrying a redundant row driver ($RRD_0$) signal. Decoder means 56 is coupled to row address decoder means 42 via lines 60 for receiving and decoding any one of the row addresses $A_5$–$A_{11}$. When programmed, as will be further described, the redundant row address decoder means 56 will decode the row address $A_5$–$A_{11}$ to the defective row R, i.e., row $R_{50}$ in the example, whereby the redundant row $RR_0$ will be selected.

The redundant memory circuit 18 further has means 62 for programming the programmable redundant row address decoder means 56 to decode the row address $A_5$–$A_{11}$ of any defective row $R_0$–$R_{127}$, such as the defective row $R_{50}$. In general, programming means 62 responds to $CS_0$–$CS_6$ on lines 52 to sequentially program, respectively, via lines 64, the bits of the defective row address $A_5$–$A_{11}$ into the decoder means 56. Thus, the number of column select signals on lines 52 is at least equal to the number of bits of the row addresses $A_5$–$A_{11}$, so that, in the present example, there are 7 signals $CS_0$–$CS_6$ for the 7 bits of the row addresses $A_5$–$A_{11}$, respectively.

In particular, and as also shown in FIG. 2, the programming voltage on line 38 from supply 36 (see FIG. 1) is coupled through pin $P_3$ and over a line 66 to programming means 62. Also, the chip select signal CS from signal generator 32 (see FIG. 1) is coupled through line 34 via pin $P_{CS}$ and over a line 68 to programming means 62 which also receives $A_4/\overline{A}_4$ on lines 46. With the programming voltage being supplied on line 66, and in response to CS on line 68 and $A_4/\overline{A}_4$ on lines 46, programming current will be gated from programming means 62 to decoder means 56 via lines 64 to program the bits of the defective row address $A_5$–$A_{11}$ in response to $CS_0$–$CS_6$ which are generated from $A_0$–$A_2$ of the column addresses $A_0$–$A_4$. Essentially, therefore, the sequential generation of $CS_0$–$CS_6$ on lines 52 results in programming means 62 providing a multiplexing function by which the programming voltage on line 66 is used to produce sequentially the programming current on lines 64 for programming the bits of the defective row address $A_5$–$A_{11}$ into decoder means 56.

Bits $A_4$ and $\overline{A}_4$ are used by programming means 62 if the memory 20 is manufactured with redundant row $RR_0$ and another redundant row $RR_1$ (see FIG. 3) for replacing another defective row R. In this event, programming means 62 will program decoder means 56 to decode another defective row address $A_5$–$A_{11}$, and thereby select the other redundant row $RR_1$.

Another feature of the redundant memory circuit 18 is a means 70 for verifying the selection of a redundant row $RR_0$ or $RR_1$ and for verifying the proper programming of the programmable decoder means 56. Means 70 responds to $A_4$ and $\overline{A}_4$ on lines 46 to sense, via lines 72, this selection and proper programming. The verification can occur without using additional pins P on package 12 and may be performed by the manufacturer or user of package 12, as will be described more fully below.

In operation, generally, assume that IC package 12 having the redundant memory circuit 18 has been manufactured with one redundant row $RR_0$. Also, assume that the above-mentioned "array blank checking" procedure has been or is being performed and that row $R_{50}$ is identified as being defective.

Then, in accordance with the present invention, the row address $A_5$–$A_{11}$ to defective row $R_{50}$ is supplied to or held via pins $P_5$–$P_{11}$ at row address decoder means 42 which responds by driving on row $R_{50}$ via one of the lines 54. Then, with this defective row address $A_5$–$A_{11}$ being held at decoder means 42, the column addresses $A_0$–$A_4$ are sequentially generated and supplied to pins $P_0$–$P_4$, whereby $CS_0$–$CS_{15}$ are sequentially produced in response to $A_0$–$A_3$ to access respectively the plurality of columns $C_0$–$C_{31}$ with $A_4$ and $\overline{A}_4$ activating bank $B_1$ and bank $B_2$, respectively. As will be further described, when each column $C_0$–$C_{31}$ is accessed, programming current is supplied through the respective columns $C_0$–$C_{31}$ to program or open the associated programmable devices PD coupled to row $R_{50}$, whereby the entire defective row $R_{50}$ will be physically disconnected from the plurality of columns $C_0$–$C_{31}$.

With the defective row $R_{50}$ now deselected, the redundant row $RR_0$ is then to be selected. To select the redundant row $RR_0$, the defective row address $A_5$–$A_{11}$ is held at the pins $P_5$–$P_{11}$. Then, the column addresses $A_0$–$A_4$ are again sequentially supplied to pins $P_0$–$P_4$, whereby column address decoder means 40 outputs sequentially $CS_0$–$CS_6$ in response to $A_0$–$A_2$ on lines 44 and, hence, lines 52. Programming means 62 responds to $CS_0$–$CS_6$, to CS on line 68 and to the programming voltage on line 66 by sequentially gating programming current onto lines 64 to programmable redundant row address decoder means 56. Consequently, each bit of the defective row address $A_5$–$A_{11}$ for defective row $R_{50}$ is programmed into decoder means 56. Therefore, with decoder means 56 so programmed, whenever thereafter the defective row address $A_5$–$A_{11}$ to defective row $R_{50}$ is produced, both decoder means 56 and decoder means 42 will respond to drive on defective row $R_{50}$ and the redundant row $RR_0$ However, since defective row $R_{50}$ has been previously disconnected, only redundant row $RR_0$ is effectively selected.

After deselecting the defective row $R_{50}$ and selecting the redundant row $RR_0$, the means 70 can be utilized to perform the above-mentioned verification function, as will be more fully described below.

Figure 3:
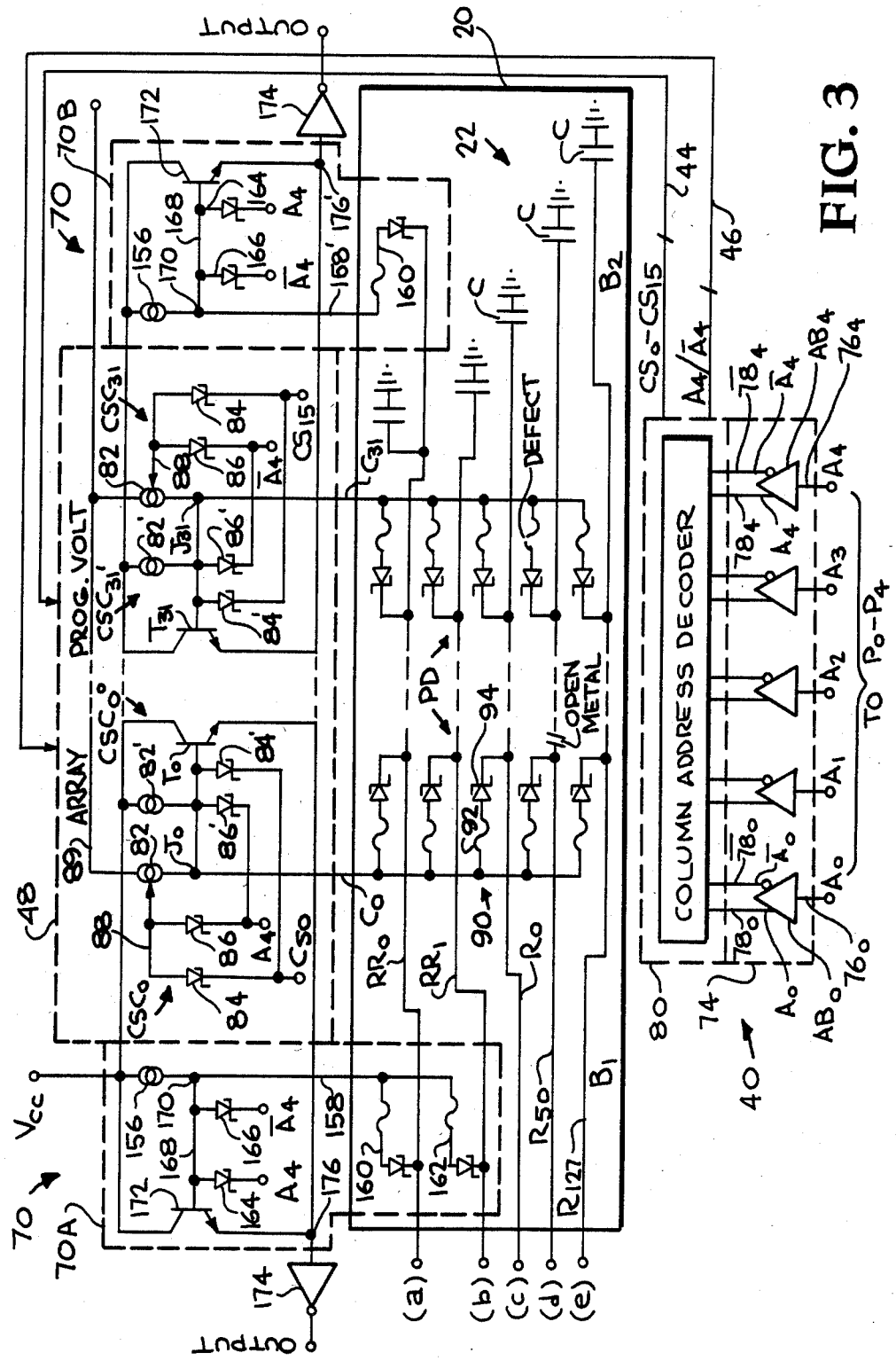
FIG. 3 is a schematic illustration of circuit components of the present invention shown in FIG. 2.

As shown in more detail in FIG. 3, the column address decoder means 40 includes a column address buffer 74 of individual address buffers $AB_0$–$AB_4$ for receiving on input lines $76_0$–$76_4$ respectively, the bits of column addresses $A_0$–$A_4$ Each buffer $AB_0$–$AB_4$ outputs on lines $78_0$, $\overline{78}_0$–$78_4$, $\overline{78}_4$ the true and complementary logic values of the corresponding bit it receives, so that, for example, buffer $AB_0$ outputs $A_0$ and $\overline{A}_0$ on lines $78_0$, $\overline{78}_0$ respectively. A column address decoder 80 receives the true and complementary outputs of the respective address buffers $AB_0$–$AB_4$ to decode the column addresses $A_0$–$A_4$. Thus, decoder 80 outputs any one of $CS_0$–$CS_{15}$ on respective lines 44 in response to $A_0$–$A_3$ of a given column address $A_0$–$A_4$ on lines $76_0$–$76_3$, and $A_4$ and $\overline{A}_4$ on lines 46 in response to $A_4$ on line $76_4$.

The column select circuit means 48 includes respective column select circuits $CSC_0$–$CSC_{31}$ for supplying current to the respective columns $C_0$–$C_{31}$. Each column select circuit $CSC_0$–$CSC_{31}$ includes a programming current source 82 coupled to respective columns $C_0$–$C_{31}$, together with a Schottkey diode 84 and a Schottkey diode 86 which are coupled to a common gating line 88 to gate programming current to flow to the respective columns $C_0$–$C_{31}$ when diodes 84, 86 are biased. As indicated, diodes 84 are biased in response to $CS_0$–$CS_{15}$, respectively, while diodes 86 are biased by $A_4$ or $\overline{A}_4$, as will be further described. Programming current sources 82 receive a conventional "array programming voltage" on a common line 89.

In the operation of column select circuits $CSC_0$–$CSC_{15}$, assume that $A_4$ is at logic 1 to bias the associated diodes 86. Then, in connection with column select circuit $CSC_0$ of $CSC_0$–$CSC_{15}$, when $CS_0$ is at logic 1, the associated diode 84 is biased and programming current from source 82 will be gated to flow along column $C_0$. When $CS_0$ is at logic 0, current will not be gated to flow to column $C_0$. A similar operation occurs for column select circuits $CSC_1$–$CSC_{15}$ in response to $CS_1$–$CS_{15}$, respectively, with $A_4$ remaining at logic 1. Since CS are generated sequentially in response to $A_0$–$A_3$ of the sequentially generated column addresses $A_0$–$A_4$, each column $C_0$–$C_{15}$ is sequentially accessed.

Similarly, assume that $\overline{A}_4$ is at logic 1 to bias the associated diodes 86 of $CSC_{16}$–$CSC_{31}$. Then, when $CS_0$–$CS_{15}$ are generated, as mentioned above, programming current from sources 82 of $CSC_{16}$–$CSC_{31}$ will be gated sequentially to flow along columns $C_{16}$–$C_{31}$.

FIG. 3 also shows in more detail the memory 20 and, in particular, the matrix 22 having the plurality of rows $R_0$–$R_{127}$ and the plurality of columns $C_0$–$C_{31}$ being interconnected by the programmable devices PD. Also shown is the redundant row $RR_0$ and another redundant row $RR_1$, each of which can be used to replace a defective row $R_0$–$R_{127}$. As is conventional, 1 bit of information is stored at each interconnection or programmable device PD between a given column $C_0$–$C_{31}$ and a given row $R_0$–$R_{127}$. Each programmable device PD includes a programmable element 90, such as a fuse 92, and, for example, a Schottky diode 94. If the fuse 92 is not programmed, i.e., if it remains closed as shown, this constitutes one logic state, e.g., logic 0, and if it is programmed or "blown", i.e., if it is opened, this constitutes the other logic state, i.e., logic 1. As is known, at each interconnection PD, if a fuse 92 is not blown, parasitic capacitance C exists, which must be charged along a given addressed column $C_0$–$C_{31}$, which thereby slows the speed at which the stored information can be accessed when the columns $C_0$–$C_{31}$ along an addressed row $R_0$–$R_{127}$ are sequentially addressed. In accordance with the present invention, by disconnecting the entire defective row $R_{50}$ from the plurality of columns $C_0$–$C_{31}$, the parasitic capacitance C is not present at that row and the memory speed is not reduced when accessing a good row R (shown in FIG. 1).

Defective row $R_{50}$, as shown in FIG. 3, can have one or more of a number of known defects that prevent its use for the storage of information. For example, a fuse 92 interconnecting column $C_{31}$ and row $R_{50}$ can be defective, e.g., it can be open as manufactured when it should be closed at this time. Or, for example, row $R_{50}$ can have an open metal line between column $C_8$ and column $C_9$ (not specifically shown), thereby preventing the bits stored at columns $C_9$–$C_{31}$ from being read along row $R_{50}$. In accordance with the present invention, when row $R_{50}$ is detected to have any one or more of these defects, it will be entirely disconnected from columns $C_0$–$C_{31}$ by opening all associated fuses 92 and will be replaced by, for example, redundant row $RR_0$.

In the operation of FIG. 3 thus far described, assume that using the conventional "array blank checking" that row $R_{50}$ has been determined to be defective and is presently being addressed by row address decoder means 42 in response to the address $A_5$–$A_{11}$ to row $R_{50}$ (see FIG. 2). Also assume that $A_4$ on line $76_4$ is high and that $A_4$ on lines 46 is at logic 1, thus biasing diodes 86 associated with $CSC_0$–$CSC_{15}$. Then, with column addresses $A_0$–$A_4$ being sequentially generated, $A_0$–$A_3$ sequentially provide $CS_0$–$CS_{15}$. Therefore, diodes 84 of $CSC_0$–$CSC_{15}$ are sequentially biased, whereby programming current flows through columns $C_0$–$C_{15}$ and programmable devices PD, sequentially, to the addressed row $R_{50}$ and is sunk by a row driver $RD_{50}$ (see FIG. 4). Consequently, the associated fuses 92 between each column $C_0$–$C_{15}$ and the defective row $R_{50}$ are blown.

Next, $A_4$ at line $76_4$ is brought low, thus bringing $\overline{A}_4$ on line 46 to a logic 1 and biasing diodes 86 of $CSC_{16}$–$CSC_{31}$. Then, $A_0$–$A_3$ are again sequenced to provide sequentially $CS_0$–$CS_{15}$. Therefore, diodes 84 of $CSC_{16}$–$CSC_{31}$ are sequentially biased, whereby programming current now flows to $C_{16}$–$C_{31}$ and the respective programming devices PD, sequentially to the addressed row $R_{50}$. Consequently, the associated fuses 92 between the remaining columns $C_{16}$–$C_{31}$ and the defective row $R_{50}$ are disconnected by programming them to an open state.

Now, the entire defective row $R_{50}$ is disconnected from the plurality of columns $C_0$–$C_{31}$. This completes the procedure for deselecting row $R_{50}$. Any other row R that is detected and determined to be defective can be deselected in a similar manner.

Also shown in FIG. 3 are conventional column select circuits $CSC'_0$–$CSC'_{31}$ for accessing the columns $C_0$–$C_{31}$ to read data that are stored in the memory 20. Column select circuits $CSC'_0$–$CSC'_{31}$ have read current sources 82' coupled in common to $V_{cc}$ via a line 89', diodes 84' which are biased by $CS_0$–$CS_{15}$, respectively, and diodes 86' which are biased by $A_4$ (for $CSC'_0$–$CSC'_{15}$) and $\overline{A}_4$ (for $CSC'_{16}$–$CSC'_{31}$). Circuits $CSC'_0$–$CSC'_{31}$ have junctions $J_0$–$J_{31}$ coupled to columns $C_0$–$C_{31}$, respectively, and transistors $T_0$–$T_{31}$, respectively. As may be readily seen, when $A_4$ is at logic 1 and $CS_0$–$CS_{15}$ are sequentially produced, read current is sequentially supplied from sources 82' and via junctions $J_0$–$J_{15}$ of $CSC'_0$–$CSC'_{15}$ to columns $C_0$–$C_{15}$ to read data. When $\overline{A}_4$ is at logic 1 and $CS_0$–$CS_{15}$ are sequentially produced, read current is sequentially supplied from sources 82' and via junctions $J_{16}$–$J_{31}$ of $CSC'_{16}$–$CSC'_{31}$ to columns $C_{16}$–$C_{31}$ to read data.

Figure 4:
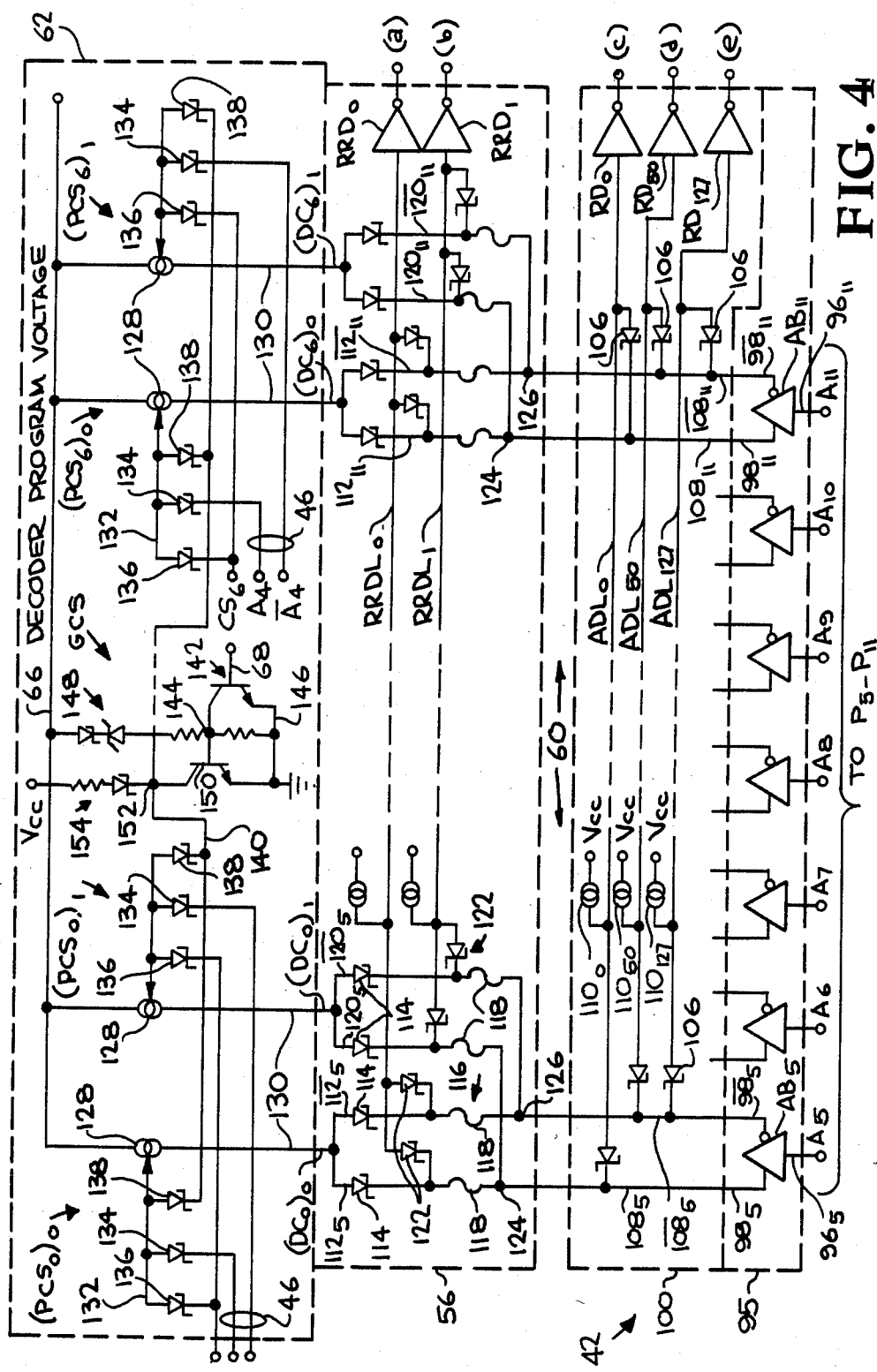
FIG. 4 is a schematic illustration of other circuit components of the present invention of FIG. 2.

With reference to FIG. 4, the row address decoder means 42 includes a row address buffer 95 having individual address buffers $AB_5$–$AB_{11}$ for receiving, respectively, on lines $96_5$–$96_{11}$ the bits of the row addresses $A_5$–$A_{11}$. The outputs of each address buffer $AB_5$–$AB_{11}$ are the true and complementary logic values of the inputs so that, for example, address buffer $AB_5$ outputs $A_5$ and $\overline{A}_5$ on respective lines $98_5$, $\overline{98}_5$. Each address buffer $AB_5$–$AB_{11}$ will sink programming current received at one of its outputs to program redundant row address decoder means 56 with one or more defective row addresses, as will be further described.

A conventional row address decoder 100 of decoder means 42 has address decoder lines $ADL_0$–$ADL_{127}$ and row drivers $RD_0$–$RD_{127}$ coupled, respectively, to rows $R_0$–$R_{127}$. Decoder lines $ADL_0$–$ADL_{127}$ have Schottky diodes 106 coupled to pairs of column lines $\overline{108}_5$, $108_5$ . . . $\overline{108}_{11}$, $108_{11}$ leading to respective lines $98_5$, $\overline{98}_5$ . . . $98_{11}$, $\overline{98}_{11}$. Each decoder line $ADL_0$–$ADL_{127}$ is supplied with decoder current via respective current sources $110_0$–$110_{127}$. If, for example, row $R_0$ were to be addressed, then address $A_5$–$A_{11}$ would be 1111111, resulting in only $ADL_0$ decoding this address to drive on row $R_0$ via row driver $RD_0$. In a similar manner, the other lines $ADL_1$–$ADL_{127}$ uniquely decode the respective row addresses $A_5$–$A_{11}$.

The programmable redundant row address decoder means 56, which, as previously mentioned, can be programmed to decode any one of the row addresses $A_5$–$A_{11}$, has a redundant row decoder line $RRDL_0$ and redundant row driver $RRD_0$ for accessing the redundant row $RR_0$, and a plurality of decoder columns $(DC_0)_0$–$(DC_6)_0$, respectively, interconnected with $RRDL_0$. In particular, the plurality of decoder columns $(DC_0)_0$–$(DC_6)_0$ includes programming current lines $112_5$–$112_{11}$ ultimately terminating at the true outputs of the address buffers $AB_5$–$AB_{11}$ via lines $108_5$–$108_{11}$ and parallel programming current lines $\overline{112}_5$–$\overline{112}_{11}$ ultimately terminating at the complementary outputs of the address buffers $AB_5$–$AB_{11}$ via lines $\overline{108}_5$–$\overline{108}_{11}$. Each such programming current line has a series-connected Schottky diode 114 and programmable element 116, such as a decoder fuse 118. Line $RRDL_0$ is coupled to each programming line $112_5$, $\overline{112}_5$ . . . $112_{11}$, $\overline{112}_{11}$ of the decoder columns $(DC_0)_0$–$(DC_6)_0$ via respective diodes 122 which are connected between diode 114 and decoder fuse 118 of each such line.

Similarly, decoder means 56 has a redundant row decoder line $RRDL_1$ and a redundant row driver $RRD_1$ for accessing the redundant row $RR_1$ and a plurality of decoder columns $(DC_0)_1$–$(DC_6)_1$, respectively, interconnected with $RRDL_1$. The plurality of decoder columns $(DC_0)_1$–$(DC_6)_1$ includes programming current lines $120_5$–$\overline{120}_{11}$ ultimately terminating at the true outputs of address buffers $AB_5$–$AB_{11}$ via junctions 124 and parallel programming current lines $120_5$–$120_{11}$ ultimately terminating at the complementary outputs of $AB_5$–$AB_{11}$ via junctions 126. Each such programming current line similarly has the series-connected diode 114 and decoder fuse 118, as shown. Line $RRDL_1$ is similarly coupled to the respective lines of decoder columns $(DC_0)_1$–$(DC_6)_1$ via diodes 122.

As will be further described, one of the decoder fuses 118 of each pair of lines $112_5$, $\overline{112}_5$ . . . $112_{11}$, $\overline{112}_{11}$ of decoder columns $(DC_0)_0$–$(DC_6)_0$ will be programmed or blown in dependence on a defective row address $A_5$–$A_{11}$. The result will be that redundant row decoder line $RRDL_0$ will decode that defective row address to access the redundant row $RR_0$. Similarly, one of the decoder fuses 118 of each pair of lines $120_5$, $\overline{120}_5$ . . . $120_{11}$, $\overline{120}_{11}$ of decoder columns $(DC_0)_1$–$(DC_6)_1$ will be programmed or blown in dependence on another defective row address $A_5$–$A_{11}$. The result will be that redundant row decoder line $RRDL_1$ will decode this other defective row address to access redundant row $RR_1$.

The programming means 62 preferably includes a plurality of programming circuit sections $(PCS_0)_0$–$(PCS_6)_0$ for programming or controlling the flow of programming current to the plurality of decoder columns $(DC_0)_0$–$(DC_6)_0$. Another plurality of programming circuit sections $(PCS_0)_1$–$(PCS_6)_1$ are used for programming or controlling the flow of programming current to the plurality of decoder columns $(DC_0)_1$–$(DC_6)_1$. Means 62 preferably also includes a gating circuit section (GCS) which is common to all the programming circuit sections $(PCS_0)_0$–$(PCS_6)_0$, $(PCS_0)_1$–$(PCS_6)_1$ and which controls the gating of the programming current by the programming means 62 to the decoder means 56.

Each programming circuit section $(PCS_0)_0$–$(PCS_6)_0$ and $(PCS_0)_1$–$(PCS_6)_1$ receives the programming voltage on the common line 66 (see FIG. 2) when the programming voltage is applied to pin $P_3$. The programming circuit sections $(PCS_0)_0$–$(PCS_6)_0$ have respective current sources 128 for supplying programming current over lines 130 to the respective decoder columns $(DC_0)_0$–$(DC_6)_0$ in response to the programming voltage on line 66 when gated by lines 132. In this aspect of the invention, the programming circuit sections $(PCS_0)_0$–$(PCS_6)_0$ have diodes 134 connected between lines 132 and one of the lines 46 (see FIG. 2) carrying $A_4$. If $A_4$ is at logic 0, programming current from current sources 128 will be gated off via diodes 134 and lines 132. Therefore, when $A_4$ is at logic 0, all the programming circuit sections $(PCS_0)_0$–$(PCS_6)_0$ will be disabled in that no programming current will be supplied to the respective decoder columns $(DC_0)_0$–$(DC_6)_0$. On the other hand, if $A_4$ is at logic 1, diodes 134 will be biased, whereby programming current sources 128 can be gated on to supply programming current over lines 130 to the decoder columns $(DC_0)_0$–$(DC_6)_0$.

Other diodes 136 of $(PCS_0)_0$–$(PCS_6)_0$ are coupled between lines 132 and respective lines 52 (see FIG. 2) carrying $CS_0$–$CS_6$. When $CS_0$–$CS_6$, respectively, are at logic 0, programming current from current sources 128 will be gated off by lines 132 and diodes 136 whereby programming current is not supplied to the decoder columns $(DC_0)_0$–$(DC_6)_0$. When $CS_0$–$CS_6$ are at logic 1, diodes 136 are biased and current sources 128 are thereby gated on and can supply the programming current over lines 130 to the decoder columns $(DC_0)_0$–$(DC_6)_0$. Since $CS_0$–$CS_6$ are sequentially switched to a logic 1 state, as previously mentioned, only one of the current sources 128 at a given time will be gated on and allowed to direct the programming current to the corresponding decoder column $(DC_0)_0$–$(DC_6)_0$. This in effect constitutes a multiplexing function of the programming means 62, whereby the programming current from sources 128 are multiplexed or sequentially gated or turned on so that programming current can be supplied to the respective decoder columns $(DC_0)_0$–$(DC_6)_0$. During this column sequencing, all the row address buffers $AB_5$–$AB_{11}$ are at the normal logic levels required to address the defective row, so that contrary to prior redundant memory circuits, high voltage levels need not be multiplexed to the inputs of $AB_5$–$AB_{11}$.

Each programming circuit section $(PCS_0)_0$–$(PCS_6)_0$ also has a diode 138 which is coupled between the line 132 and the output of the gating circuit section GCS over a line 140. When line 140 is at logic 0, the programming current from current sources 128 is gated off via lines 132, diodes 138 and line 140, as will be further described. When line 140 is switched logic 1, diodes 138 are biased and the programming current from sources 128 can be gated on to flow over lines 130 to the respective decoder columns $(DC_0)_0$–$(DC_6)_0$.

The programming circuit sections $(PCS_0)_1$–$(PCS_6)_1$ for supplying programming current to the decoder columns $(DC_0)_1$–$(DC_6)_1$ are similar to the programming circuit sections $(PCS_0)_0$–$(PCS_6)_0$. Thus, for $(PCS_0)_1$–$(PCS_6)_1$, current sources 128 are coupled to the line 66, diodes 136 are coupled, respectively, to the lines 52 (see FIG. 2) carrying $CS_0$–$CS_6$ and diodes 138 are coupled to the gating control section GCS. However, the diodes 134 of $(PCS_0)_1$–$(PCS_6)_1$ are coupled to the other of the lines 46 carrying $\overline{A}_4$. Thus, either diodes 134 of $(PCS_0)_1$–$(PCS_6)_1$ or diodes 134 of $(PCS_0)_0$–$(PCS_6)_0$ will be biased for enabling current sources 128 of the former or current sources 128 of the latter to supply programming current to the plurality of decoder columns $(DC_0)_1$–$(DC_6)_1$ or the plurality of decoder columns $)_0$–$(DC_6)_0$.

The gating control section GCS includes a transistor 142 whose base is coupled via line 68 to pin $P_{cs}$ carrying CS (See FIG. 2). The collector of transistor 142 is coupled to a junction 144 and the emitter is coupled to ground over a line 146. A resistor-diode path shown generally at 148 is coupled between the line 66 carrying the programming voltage and junction 144. Another transistor 150 is base biased by the voltage at junction 144 and has its collector coupled to a junction 152 leading to output line 140 and its emitter coupled to ground. A resistor-diode path shown generally at 154 is coupled to junction 152 and the positive supply voltage $V_{cc}$.

In the operation of GCS, when CS on line 68 is at logic 0, transistor 142 is biased off, whereby current in path 148 produces a biasing voltage at junction 144 to turn on transistor 150. Consequently, current flows from path 154 through junction 152 and transistor 150 to ground, whereby line 140 is at logic 0. When CS is switched to a logic 1, transistor 142 is turned on, and transistor 150 base current flows through path 148, junction 144 and through the collector of turned on transistor 142 to ground via line 146, whereby transistor 150 is turned off. Consequently, junction 152 and line 140 are switched to a logic 1 to bias all the diodes 138.

In operation generally to program decoder means 56 to select redundant row $RR_0$, assume that, for example, the defective row address $A_5$–$A_{11}$ to defective row $R_{50}$ is inputted to address buffers $AB_5$–$AB_{11}$. Depending on the logic 1 or logic 0 state of each of the bits of this defective row address $A_5$–$A_{11}$, one of the output lines $98_5, \overline{98}_5 \ldots 98_{11}, \overline{98}_{11}$ of each address buffer $AB_5$–$AB_{11}$ will be at logic 0, whereby $AB_5$–$AB_{11}$ can sink programming current via those logic 0 lines. Also assume that $A_4$ is at logic 1 to bias diodes 134 of $(PCS_0)_0$–$(PCS_6)_0$.

Then, a relatively high programming voltage, e.g. 20 volts, is applied via pin $P_3$ and line 66 to $(PCS_0)_0$–$(PCS_6)_0$. Next, the first column address $A_0$–$A_4$ is generated, resulting in a logic 1 $CS_0$ from bits $A_0$–$A_2$ to bias diode 136 of $(PCS_0)_0$ while $CS_1$–$CS_6$ are at logic 0. Then, a logic 1 CS is supplied to line 68, resulting in line 140 going to logic 1 and diode 138 being biased. Consequently, programming current from source 128 is now gated onto line 130 to decoder column $(DC_0)_0$.

As a result, the programming current will flow through line $112_5$ or line $\overline{112}_5$, depending on the logic state of bit $A_5$, as previously mentioned, resulting in the associated fuse 118 being blown or opened, and leaving the other fuse 118 closed. Consequently, the diode 122 coupled to the fuse 118 that is not blown will be in circuit with the redundant row decoder line $RDRL_0$. At this point, one bit, i.e., $A_5$, is programmed into $RRDL_0$ of decoder means 56.

Thereafter, to program bit $A_6$ of the defective row address $A_5$–$A_{11}$, the programming voltage on line 66 is lowered and CS on line 68 is switched to logic 0. Then, the column address $A_0$–$A_4$ is incremented, resulting in a logic 1 $CS_1$, with $CS_0$, $CS_2$–$CS_6$ being at logic 0. Next, the programming voltage is again raised on line 66 and then CS is switched to a logic 1. Consequently, programming current is supplied to $(DC_1)_0$ (not specifically shown), resulting, in a similar manner as previously described, in one of the decoder fuses (not shown) being blown, with the other decoder fuse remaining closed.

Thereafter, a similar procedure occurs for programming, bit-by-bit, the defective row address $A_5$–$A_{11}$ held at address buffers $AB_5$–$AB_{11}$. This results in redundant row decoder line $RRDL_0$ being coupled to address buffers $AB_5$–$AB_{11}$ in the identical manner that the address decoder line $ADL_{50}$ for defective row $R_{50}$ in the present example is coupled to $AB_5$–$AB_{11}$. Therefore, whenever this defective row address $A_5$–$A_{11}$ is present at $AB_5$–$AB_{11}$, it will be decoded by $RRDL_0$ to select redundant row $RR_0$ in lieu of defective row $R_{50}$.

Furthermore, $RRDL_1$ can be programmed in a similar manner to decode another defective row address to another defective row $R_0$–$R_{49}$, $R_{51}$–$R_{127}$. To accomplish this, the other defective row address $A_5$–$A_{11}$ is held at $AB_5$–$AB_{11}$ and $\overline{A}_4$ is held at logic 1 to activate $(PCS_0)_1$–$(PCS_6)_1$. Consequently, programming current can be sequentially gated to $(DC_0)_1$–$(DC_6)_1$ to program $RRDL_1$.

By performing the gating function mentioned above, the programming voltage on line 66 will be allowed to build up to its full value, e.g. 20 volts, before the programming current is gated on, resulting in a "rush" of programming current when the logic 1 CS is produced on line 68. This rush of programming current, therefore, will ensure that the particular decoder fuse 118 will be fully blown open and, thereby, reliably program decoder means 56.

In the overall specific operation of the present invention to deselect defective row $R_{50}$ and select redundant row $RR_0$, assume that the "array blank checking" is occurring with the row address $A_5$–$A_{11}$ to row $R_{50}$ being inputted to $AB_5$–$AB_{11}$. Assume also that using this "array blank checking" procedure, row $R_{50}$ has been determined to be defective.

Now, with the defective row address $A_5$–$A_{11}$ being generated by address generator 24 and being held at $AB_5$–$AB_{11}$, address decoder line $ADL_{50}$ of decoder 95 responds by driving on row $R_{50}$ via row driver $RD_{50}$. Then, the column addresses $A_0$–$A_4$ are sequentially generated by address generator 24 and received by $AB_0$–$AB_4$. Therefore, column address decoder 80 sequentially generates $CS_0$–$CS_{15}$, and $A_4$ and $\overline{A}_4$ to provide programming current from current sources 82 to columns $C_0$–$C_{31}$. Consequently, the fuses 92 coupling columns $C_0$–$C_{31}$ to addressed row $R_{50}$ are sequentially blown, whereby row $R_{50}$ is entirely disconnected from columns $C_0$–$C_{31}$.

Next, to select the redundant row $RR_0$, the defective row address $A_5$–$A_{11}$ is continued to be generated by address generator 24 and held at $AB_5$–$AB_{11}$. Then, program voltage supply 36 is activated to provide programming voltage via pin $P_3$ to line 66. Next, address generator 24 is incremented to produce the column address $A_0$–$A_4$ at $AB_0$–$AB_4$ that results, via $A_0$–$A_2$, in the logic 1 $CS_0$. Then, the control signal generator 32 is enabled to produce CS on line 68 and, thereby, gate programming current to decoder column $(DC_0)_0$.

Thereafter, the supply of the programming voltage is discontinued and CS is switched to logic 0. Then, the programming voltage again is supplied by supply 36 and the column address $A_0$–$A_4$ produced by address generator 24 is incremented, whereby a logic 1 $CS_1$ is produced. Next, a logic 1 CS again is produced by generator 32, so that now programming current is gated to the decoder column $(DC_1)_0$.

The above procedure continues through to the generation of $CS_6$ to program the bits of the defective row address $A_5$–$A_{11}$ into $RRDL_0$. Furthermore, as can now be appreciated, a similar operation occurs if another defective row R is detected to deselect that defective row and to select the redundant row $RR_1$ by programming $RRDL_1$.

With the IC package 12 now being programmed with at least redundant row $RR_0$ being selected, the system 10 can be used by the package manufacturer to verify this selection via verification means 70. Alternatively, the IC package 12 can now be sold to a user who can perform the verification using its own address generator 24, as now will be described.

With reference again to FIG. 3, the verifying means 70 includes a circuit 70A and a circuit 70B. Circuit 70A has a current source 156 for supplying current along a line 158 which is coupled to redundant row $RR_0$ via an interconnection 160 and to redundant row $RR_1$, via an interconnection 162. A diode 164 and a diode 166 are coupled to a line 168, which is connected to a junction 170, and can be biased by $A_4$ and $\overline{A}_4$ being at logic 1. $A_4$ and $\overline{A}_4$ are both forced to a logic 1 by applying a voltage much higher than a normal logic 1 to the $A_4$ input buffer $AB_4$ at line $76_4$, e.g. 13 volts. This high voltage overrides the normal function of the buffer $AB_4$ using a 5 V Zener diode circuit (not shown) to force the $\overline{A}_4$ line $\overline{78}_4$ to a logic 1 while the $A_4$ true output $78_4$ goes to logic 1 by the normal circuitry used in the $A_4$ address buffer $AB_4$. Under this biasing condition, a transistor 172 can be turned on. A sense amplifier 174 is coupled to the emitter of transistor 172 via a junction 176 to sense the on-off state of transistor 172.

Circuit 70B similarly has a current source 156, diode 164, diode 166, line 168, junction 170, transistor 172, and junction 176 coupled to a sense amplifier 174. However, the comparable line 158' of circuit 70B is coupled only to redundant row $RR_0$ via an interconnection 160.

In operation, and to verify that redundant memory circuit 18 has at least one redundant row $RR_0$ or $RR_1$ replacing a defective row R, such as row $R_{50}$, all the columns $C_0$–$C_{31}$ are deactivated by causing $CS_0$–$CS_{15}$ to be at logic 0. Then lines 158 and 158' are selected by supplying a high voltage, e.g., 13 volts, to $AB_4$ via pin $P_4$, whereby $A_4$ and $\overline{A}_4$ go to logic 1 to bias diodes 164 and 166 of circuit 70A and circuit 70B. If it is assumed that neither redundant row $RR_0$ nor redundant row $RR_1$ is being addressed, i.e., line 158 and 158' are now decoupled from rows $RR_0$ and $RR_1$ because their respective row drivers $RRD_0$ and $RRD_1$ are held off via decoder means 56, then no current will flow from sources 156 of circuit 70A and circuit 70B and biasing voltages are developed at junctions 170 to turn on the respective transistors 172. The respective sense amplifiers 174 will sense the on state of transistors 172.

Then, redundant row $RR_0$ is addressed, as previously indicated, via the programmed decoder means 56. Consequently, line 158 and line 158' are now coupled to redundant row $RR_0$, whereby current will flow from sources 156 and via interconnection 160 to redundant row $RR_0$. Consequently, transistors 172 of circuit 70A and circuit 70B will now be turned off, and this will be sensed by the respective sense amplifiers 174, thereby indicating that redundant row $RR_0$ is active or selected. The explicit identity of the redundant row $RR_0$ is established by considering the outputs of the sense amplifiers as respective bits in a bit code.

Next, redundant row $RR_1$ is activated by the programmed decoder means 56. Now, current will flow from source 156, along line 158 and via interconnection 162 to redundant row $RR_1$, whereby transistor 172 of circuit 70A remains off. However, with redundant row $RR_0$ not being addressed, current from source 156 of circuit 70B now cannot flow along line 158', whereby transistor 172 of circuit 70B is biased on. The off state of transistor 172 of circuit 70A and on state of transistor 172 of circuit 70B are sensed by respective sense amplifiers 174, thereby indicating that redundant row $RR_1$ is active or selected. Again, the explicit identity of the redundant row is established by the identifying code provided by considering the outputs of the sense amplifiers 174.

While not previously mentioned, it is possible that, for example, redundant row decoder line $RRDL_0$ of programmable decoder means 56 could be improperly programmed to decode addresses to multiple rows programmed to decode addresses to multiple rows $R_0$–$R_{127}$, when, in fact, it should only decode one address to one defective row. This could occur if, for example, the two decoder fuses 118 of a given decoder column $(DC_0)_0$–$(DC_6)_0$ are inadvertently blown or are otherwise open. As previously indicated, only one of these two decoder fuses should be blown for a given bit of row address $A_5$–$A_{11}$. Otherwise, as can be appreciated, if, for example, two separate row addresses have bit $A_5$ being logic 1 and logic 0, respectively, and if both decoder fuses 118 of decoder columns $(DC_0)_0$ are open, these bits will be decoded as the same bit, which is incorrect. If the two decoder fuses 118 of any given decoder column $(DC_0)_0$–$(DC_6)_0$ or $(DC_0)_0$–$(DC_6)_1$ are open, the redundant memory circuit 18 is bad and should be discarded or not used.

To verify if the programmable decoder means 56 has been properly programmed so that, for example, $RRDL_0$ decodes only one row $R_0$–$R_{127}$, the following procedure should be performed, bit-by-bit. First, line 58 and redundant row $RR_0$ are selected, as described above, in response to the defective row address $A_5$–$A_{11}$. Then, bit $A_5$ of row address $A_5$–$A_{11}$ at $AB_5$–$AB_{11}$ used to select row $RR_0$ is complemented. If row $RR_0$ is still selected, as sensed by sense amplifier 174 of circuit 70A and sense amplifier 174 of circuit 70B, this indicates that $RRDL_0$ is decoding more than one address, which is improper. If, upon complementing bit $A_5$ of this row address $A_5$–$A_{11}$ the row $RR_0$ is not driven on, then $RRDL_0$ may be good, depending on bits $A_6$–$A_{11}$.

Therefore, in order to complete this verification, only one bit of address $A_5$–$A_{11}$ may be complemented at a time. Thus, after bit $A_5$ of this row address $A_5$–$A_{11}$ is complemented, it must be switched back to its former, uncomplemented state to select row $RR_0$. Then, bit $A_6$ of this row address $A_5$-$A_{11}$ is complemented. Again, if row $RR_0$ is still selected, this indicates that $RRDL_0$ is decoding more than one address, which is improper. If, upon complementing bit $A_6$ of this row address $A_5$-$A_{11}$ the row $RR_0$ is not driven on, then $RRDL_0$ may be good, depending on the remaining bits $A_7$-$A_{11}$. This verification process continues through the remaining bits $A_7$-$A_{11}$.

A similar procedure can be used to verify the proper programming of decoder line $RRDL_1$.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modification as are suited to the particular use contemplated. It is intended that the scope of the invention be defined by the claims appended hereto.

We claim:

1. Apparatus for accessing information, comprising:
   (a) a memory for storing the information, said memory having a matrix of a plurality of rows and a plurality of columns and having a redundant row;
   (b) row address decoder means add column address decoder means for receiving and decoding, respectively, row and column addresses to access said plurality of rows and said plurality of columns to store the information in said memory and to deselect a defective row of said plurality of rows by accessing said memory to disconnect said defective row from all of said plurality of columns, said defective row having a row address;
   (c) programmable decoder means, coupled to said redundant row, for receiving and decoding any one of the row addresses to select said redundant row; and
   (d) means, coupled to said column address decoder means, for programming said programmable decoder means to decode said row address of said defective row.

2. Apparatus, according to claim 1, wherein said row address decoder means accesses said defective row while said column address decoder means sequentially accesses said plurality of columns to disconnect said defective row from said all of said plurality of columns.

3. Apparatus, according to claim 1, wherein said row address decoder means is non-progammable to prevent disconnecting a non-defective row of said plurality of rows from said plurality of columns.

4. Apparatus, according to claim 1, wherein said means for programming comprises means for gating programming current to said programmable decoder means.

5. Apparatus, according to claim 1, further comprising means for verifying the selection of said redundant row.

6. Apparatus, according to claim 1, further comprising means for verifying the programming of said programmable decoder means.

7. Apparatus, according to claim 1, further comprising means for verifying the selection of said redundant row and for verifying the programming of said programmable decoder means.

8. Apparatus, according to claim 1, wherein said column address decoder means and said means for programming have a common pin.

9. Apparatus, according to claim 8, wherein said common pin receives a programming voltage to program said programmable decoder means.

10. Apparatus, according to claim 1, wherein said programmable decoder means comprises:
    (a) a plurality of decoder columns having programmable decoder elements; and
    (b) a decoder line extending across and coupled to said plurality of decoder columns.

11. Apparatus, according to claim 10, wherein said means for programming sequentially accesses each of said plurality of decoder columns to program said programmable decoder elements.

12. Apparatus, according to claim 11, wherein said programmable decoder elements are decoder fuses.

13. A redundant memory circuit, comprising:
    (a) a programmable memory having a matrix of a plurality of rows and a plurality of columns, and having a redundant row extending across said plurality of columns;
    (b) row address decoder means, coupled to said plurality of rows, for receiving and decoding row addresses to access said plurality of rows;
    (c) column address decoder means, coupled to said plurality of columns, for receiving and decoding column addresses to access said plurality of columns, said row address decoder means accessing a defective row having a row address and said column address decoder means sequentially accessing said plurality of columns to disconnect said defective row from each of said plurality of columns;
    (d) programmable decoder means, coupled to said row address decoder means and to said redundant row, for receiving and decoding any one of the row addresses to said plurality of rows; and
    (e) means, coupled to said column address decoder means, for programming said programmable decoder means to decode said row address to said defective row.

14. A redundant memory circuit, according to claim 13, further comprising means for verifying the selection of said redundant row and the programming of said programmable decoder means.

15. A redundant memory circuit, according to claim 13, wherein said programmable decoder means comprises:
    (a) a plurality of decoder columns each including a first programming current line having a first programmable decoder element and a second programming current line having a second programmable decoder element; and
    (b) a decoder line extending across said plurality of decoder columns and having, for each of said plurality of decoder columns, a first diode connected to said first programming current line and a second diode connected to said second programming current line.

16. A redundant memory circuit, according to claim 15, wherein said means for programming comprises means for sequentially coupling programming current to said plurality of decoder columns.

17. A redundant memory circuit, according to claim 16, wherein the programming current is coupled to said first programming current line or said second programming current line in response to the defective row address.

18. A redundant memory circuit, according to claim 16, wherein said means for sequentially coupling comprises means for gating the programming current to said plurality of decoder columns.

19. A redundant memory circuit, according to claim 16, wherein said first programmable decoder element and said second programmable decoder element are decoder fuses.

20. An integrated circuit, comprising:
(a) a programmable read-only memory having a matrix of a plurality of rows and a plurality of columns, a first redundant row extending across said plurality of columns and a second redundant row extending across said plurality of columns;
(b) row address decoder means, coupled to said plurality of rows, for receiving and decoding row addresses;
(c) column address decoder means, coupled to said plurality of columns, for receiving and decoding column addresses, said row address decoder means accessing at least one defective row and said column address decoder means accessing sequentially said plurality of columns to disconnect said defective row from each of said plurality of columns;
(d) programmable redundant row address decoder means, coupled to said first redundant row and said second redundant row, for decoding any one of the row addresses corresponding to said plurality of rows, said programmable redundant row address decoder means including, for said first redundant row and said second redundant row, respectively,
(i) a first and second plurality of decoder columns coupled to said row address decoder means and each including a first programming current line having a first programmable decoder fuse and a second programming current line having a second programmable decoder fuse; and
(ii) first and second decoder lines extending across said plurality of first and second decoder columns and having, for each of said first and second plurality of decoder columns, a first diode connected to said first programming current line and a second diode connected to said second programming current line; and
(e) means, coupled to said column address decoder means, for programming said programmable redundant row address decoder means to decode at least one row address to said one defective row, said programming means including means for sequentially gating programming current to said plurality of decoder columns, respectively, to program said first programmable decoder fuse or said second programmable decoder fuse in response to a row address.

21. An integrated circuit according to claim 20 further comprising means for verifying the selection of the first redundant row and the second redundant row and for verifying the programming of said programmable redundant row address decoder means.

22. A method of substituting, in a memory having a matrix of a plurality of rows and a plurality of columns and a redundant row, a defective row of the plurality of rows with the redundant row, the memory being accessible in response to row addresses and column addresses, comprising:

(a) disconnecting the defective row from each of the plurality of columns in response to a row address to the defective row and the column addresses; and
(b) programming, in response to the defective row address and the column addresses, a programmable means with the defective row address being used to access the redundant row.

23. A method, according to claim 22, further comprising verifying the substitution of the defective row with the redundant row.

24. A method, according to claim 22, further comprising verifying the programming of the programmable means.

25. A method, according to claim 22, wherein the step of disconnecting comprises:
(a) accessing the defective row in response to the defective row address;
(b) sequentially accessing the plurality of columns in response to the column addresses; and
(c) programming the defective row at each sequential accessing of the plurality of columns.

26. A method, according to claim 24, wherein the plurality of rows and the plurality of columns are interconnected by programmable elements, and wherein the step of programming comprises opening the programmable elements interconnecting the defective row and the plurality of columns.

27. A method, according to claim 22, wherein the step of programming a programmable means comprises:
(a) providing the defective row address to the programmable means, the defective row address having a plurality of bits;
(b) sequentially accessing the programmable means for each bit of the plurality of bits in response to the column addresses; and
(c) programming the programmable means at each sequential accessing to decode the defective row address.

28. method, according to claim 27, wherein the step of programming at each sequential accessing comprises:
(a) supplying a programming voltage; and
(b) gating programming current to the programmable means at each sequential accessing in response to the programming voltage.

29. A method of programming a redundant memory circuit having a memory including a matrix of a plurality of rows and columns and one redundant row, one of the plurality of rows being defective, row address decoder means for accessing the plurality of rows in response to row addresses, column address decoder means for accessing the plurality of columns in response to column addresses, and programmable redundant row address decoder means for accessing the redundant row, comprising:
(a) accessing the defective row with the row address decoder means in response to a defective row address;
(b) sequentially accessing the plurality of columns with the column address decoder means in response to the column addresses;
(c) programming the addressed defective row at each sequential accessing of the plurality of columns to disconnect the defective row from each of the plurality of columns;
(d) providing the defective row address to the programmable redundant row address decoder means;

(e) sequentially accessing the programmable redundant row address decoder means in response to the column addresses; and (f) programming the programmable redundant row address decoder means at each sequential accessing of the programmable redundant row decoder means to decode the defective row address.

30. A method, according to claim 29, wherein the plurality of rows and columns are interconnected by programmable fuses, and wherein the step of programming the addressed defective row comprises opening the programmable fuses connected across the plurality of columns and the defective row.

31. A method, according to claim 29, further comprising:

(a) verifying the substitution of the defective row by the redundant row; and (b) verifying the proper programming of the programmable redundant row address decoder means.

32. A method, according to claim 29, wherein the row addresses have a plurality of bits and the programmable redundant row address decoder means includes a decoder line and a plurality of decoder columns coupled to the decoder line and associated with the plurality of bits of the row addresses, respectively, and wherein the step of sequentially accessing the programmable redundant row address decoder means comprises sequentially accessing the plurality of decoder columns.

33. A method, according to claim 32, wherein the step of programming the programmable redundant row address decoder means comprises:

(a) supplying a programming voltage; and (b) gating programming current to the plurality of decoder columns at each sequential accessing of the plurality of decoder columns in response to the programming voltage.

34. A redundant memory circuit, comprising:

(a) a memory having a matrix of a plurality of rows and columns and having a specific redundant row for storing information, the specific redundant row replacing a defective row of said plurality of rows;

(b) row address decoder means and column address decoder means for receiving row and column addresses to access said plurality of rows and columns to store and read the information;

(c) programmed decoder means, coupled to said redundant row, for receiving and decoding a row address to said defective row to select said specific redundant row; and (d) means for explicity sensing if said specific redundant row has replaced said defective row and if said programmed decoder means is responsive to a row address in addition to said row address to said defective row.

35. A redundant memory circuit, according to claim 34, wherein said defective row address has a plurality of bits, wherein said programmed decoder means receives said defective row address and has a plurality of pairs of programmable decoder elements, each of said pairs being associated with a respective one of said bits, and wherein said means for sensing senses if said redundant row is deselected by said programmed decoder means in response to complementing and recomplementing, bit-by-bit, said received defective row address.

36. A redundant memory circuit, according to claim 34, further comprising means, coupled to said specific redundant row, for explicity identifying said specific redundant row, and wherein said sensing means includes means for accessing said identifying means.

37. A method of determining, in a memory having a matrix of a plurality of rows and columns and a redundant row for replacing a defective row, and having a programmed decoder means for accessing the redundant row, if the program decoder means is accessing a row of said plurality of rows in addition to said redundant row, comprising the steps of:

(a) inputting to the program decoder means an address to said defective row, the defective row address having a plurality of bits;

(b) complementing and recomplementing the inputted defective row address, bit by bit; and (c) sensing if said redundant row is accessed in response to both the complement and recomplement of any bit of the inputted defective row address.

* * * * *